United States Patent
Fontaine et al.

(10) Patent No.: US 6,856,174 B1
(45) Date of Patent: Feb. 15, 2005

(54) VERSATILE SYSTEM FOR HIGH RESOLUTION DEVICE CALIBRATION

(75) Inventors: Paul H. Fontaine, Richardson, TX (US); Abdellatif Bellaouar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/677,105

(22) Filed: Oct. 1, 2003

(51) Int. Cl.[7] .............................................. H03K 17/00
(52) U.S. Cl. ..................................... 327/100; 327/141
(58) Field of Search ................................ 327/100, 141; 341/143, 144, 118, 120

(56) References Cited

U.S. PATENT DOCUMENTS 6,118,988 A * 9/2000 Choi ........................ 455/115.1
6,597,300 B2 * 7/2003 Mori .......................... 341/144

* cited by examiner

Primary Examiner—Linh My Nguyen
(74) Attorney, Agent, or Firm—Ronald O. Neerings; Wade James Brady, III; Frederick J. Telecky, Jr.

(57) ABSTRACT

The present invention provides a system for providing high-resolution calibration of a programmable semiconductor component (518). The system calibrates the programmable semiconductor component, within a desired accuracy, to a goal value (802). The system provides a primary DAC function (510) and a supplemental DAC function (512), as well as a control function (506). The control function is utilized to determine a first bit step (806) of the primary DAC function that corresponds to the goal value. The control function then determines a second bit step (810) of the supplemental DAC function that corresponds to the goal value. The bit codes of the first and second bit steps are combined by a summing function (514), to provide a programming control word for the programmable semiconductor component.

28 Claims, 5 Drawing Sheets

VERSATILE SYSTEM FOR HIGH RESOLUTION DEVICE CALIBRATION

TECHNICAL OF THE INVENTION

The present invention relates generally to the field of semiconductor devices and, more particularly, to apparatus and methods providing high-resolution calibration of tunable semiconductor device structures.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs.

Increasingly dense circuit design has not only improved a number of performance characteristics, it has also created a number of critical circuit design challenges. One such challenge concerns device-to-device component variations. Many applications, particularly mixed-signal applications (e.g., a target frequency oscillation), require fixed-value components. Slight changes in the effective capacitance, resistance or inductance of a semiconductor circuit can, depending upon the application, substantially alter the performance of a system—rendering it unreliable or inoperable.

Unfortunately, certain fundamental integrated circuit (IC) components (e.g., resistors, capacitors, inductors, transistors) are highly susceptible to variance (e.g., device-to-device, lot-to-lot). Minor variations in semiconductor fabrication processes can result in substantial performance disparities between identical devices. For example, in typical CMOS technologies, component variations generally range between about ±10% and about ±30%. Where a parameter of interest is the product of two or more component values (e.g., RC, LC, etc.), the single component variations can combine to have a substantial cumulative effect (e.g., ±50% or more).

In an effort to address component variations, semiconductor manufacturers have employed certain methods to calibrate component values—to provide some semblance of device-to-device consistency. This calibration is typically achieved either by trimming the component, during the test phase of production, using laser technology, or by modifying the component's effective value through use of a programmable binary-weighted array. Generally, component arrays are "programmed" by blowing fuses to select desired array is elements. The array is designed to have a nominal center value equal to the desired component value, with an array range larger than the possible spread of process variations. Usually, the array is programmed (i.e., blown fuses are selected) by way of a digital input code to a digital to analog converter (DAC). Both such methods are expensive, due either to the extra steps introduced during processing to implement the fuses or the test time needed for the laser-trimming procedure. Furthermore, both such methods are irreversible—which can present problems over time. The value of a calibrated device can change over time, due to the device's aging or the influence of other non-process related factors (e.g., temperature, stress).

Some attempts have been made to provide re-programmable arrays using linear DACs. Unfortunately, designers utilizing such systems have typically been faced with a making a trade-off between the size of the DAC and the ultimate accuracy of the component calibration value. A DAC with an infinite number of bits could, theoretically, provide an infinitely small step size between bits—allowing for a very precise, if not exact, component calibration. Practically, however, most device layouts are simply not capable of accommodating large DACs—especially not infinitely large DACs. Generally speaking, DACs on the order of 12 to 15 bits are typically too cumbersome to implement in most high-density IC devices. Frequently, size and layout limitations permit DACs on the order of 10 or fewer bits.

With DACs of this size, the step size between bits is not trivial. Often, a desired component calibration value falls in between bits. Further complicating matters, process anomalies during device fabrication typically introduce a number of variances into the bit-to-bit step sizes. For example, in a 3-bit DAC, the step between 010 and 011 may be, for example, 15% smaller than the step between 011 and 100, which itself may be, for example, 12% larger than the step between 100 and 101. Thus, where a desired component calibration value falls somewhere within a larger bit-to-bit step, highly precise (i.e., <1.0%) calibration may not be possible. Commonly, however, mixed signal device applications can require calibration of 0.5% or better.

Unable to construct a DAC of infinitely large bit size, conventional systems have focused on improving the linearity of a DAC (i.e., minimizing the variance in bit-to-bit step sizes). Such conventional systems have often focused on improving the uniformity of element sizes, and optimizing the layout and placement of elements, in order to produce a greater degree of linearity in the DAC. Unfortunately, however, such efforts are rarely able to completely mitigate the anomalies and variances introduced by fabrication processes, and frequently these efforts add considerable overhead and cost to design and layout processes.

As a result, there is a need for a high-resolution device calibration system that readily provides precise calibration in high-density IC designs in an easy, efficient and cost-effective manner.

SUMMARY OF THE INVENTION

The present invention provides a versatile, high-resolution device calibration system that provides precise device calibration. The system of the present invention is readily implemented in high-density IC designs, and overcomes the aforementioned limitations of conventional systems in an easy, efficient and cost-effective manner.

The present invention provides a sub-ranging, multiple DAC system that utilizes a successive approximation scheme to deliver a highly precise calibrated component value. The system of the present invention may be utilized to calibrate component values at predetermined periods, upon demand, or at semi-regular intervals. The present system provides multiple DACs that may be collocated within a contiguous device area, or located in separate areas—providing a high degree of design flexibility and efficiency. The system of the present invention provides a primary DAC that defines a desired component calibration value within a limited range. A secondary DAC sub-ranges the limited range of the primary DAC to define the desired component calibration value within a further limited range—one that falls within calibration tolerance. Tertiary and higher-order DACs may optionally be provided to further sub-range if desired or necessary to achieve a desired calibration tolerance. The system of the present invention does not require a high degree of linearity between DAC bits—eliminating the need for extensive matching, layout and placement efforts.

More specifically, one embodiment of the present invention provides a semiconductor device having a component requiring calibration. The device comprises an analog reference signal, a comparator function communicatively coupled to the reference signal, and a control function (e.g., a state machine) communicatively coupled to the comparator function. A primary DAC function is communicatively coupled to the control function, and to a summing function. A supplemental DAC function is communicatively coupled to the control function and to the summing function. A target component is communicatively coupled to the summing function and the comparator.

Another embodiment of the present invention provides a method of high-resolution calibration of a programmable semiconductor component. A programmable semiconductor component (e.g., a component array) is provided, having a goal component value. Primary and supplemental DAC functions are provided, along with a control function. The control function is utilized to determine a bit step of the primary DAC function that corresponds to the goal value. The control function then determines a bit step of the supplemental DAC function that corresponds to the goal value. The bit codes for these bit steps are combined to provide a control word for programming the programmable semiconductor component.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with the manufacture of semiconductor devices utilizing programmable component arrays. The specific embodiments discussed herein are merely illustrative of specific ways to make and use the invention and do not limit the scope of the invention.

The present invention provides a high-resolution calibration system that provides precise component array calibration. The system of the present invention provides a multiple DAC scheme that does not require a high degree of linearity between DAC bits. Extensive matching, layout and placement efforts are reduced or eliminated, rendering the present system readily integratable within high-density IC designs.

The present invention provides a sub-ranging, multiple DAC system that utilizes a successive approximation scheme to deliver a highly precise calibrated component value. The system of the present invention may be utilized to calibrate component values at predetermined periods, upon demand, or at semi-regular intervals. The present system provides multiple DACs that may be collocated within a contiguous device area, or located in separate areas—providing a high degree of design flexibility and efficiency. The system of the present invention provides a primary DAC that defines a desired component calibration value within a limited range. A secondary DAC sub-ranges the limited range of the primary DAC to define the desired component calibration value within a further limited range—one that falls within calibration tolerance. Tertiary and higher-order DACs may optionally be provided to further sub-range if desired or necessary to achieve a desired calibration tolerance.

Figure 1:
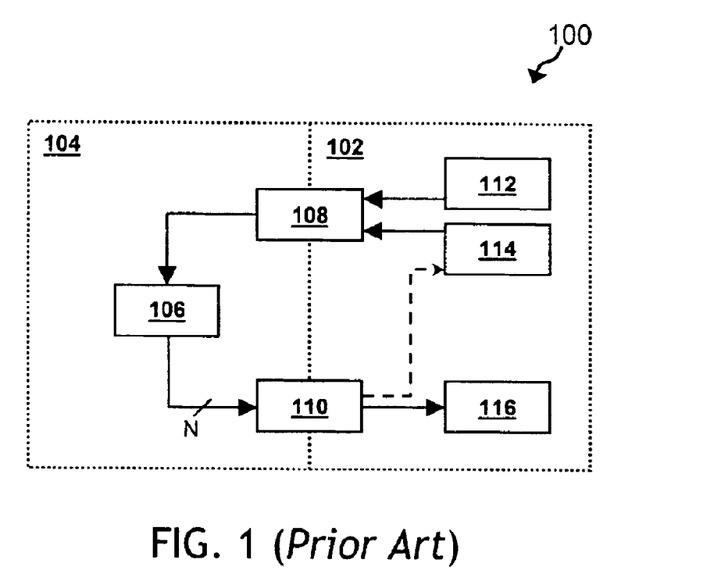
FIG. 1 is an illustration of a PRIOR ART component calibration system.

Certain aspects and embodiments of the present invention are described now with reference and in comparison to a conventional tuning system 100, as depicted in FIG. 1. System 100 is one embodiment of a conventional state machine system by which component calibration may be provided. System 100 comprises a number of components within analog operational environment 102, digital operational environment 104, or both. System 100 comprises a control state machine 106, a comparator 108, a DAC 110, a reference signal 112, an on-chip replica circuit 114, and a target component 116.

Component 116 comprises a programmable device operating in analog environment 102. Component 116 has its control word provided by DAC 110, which is an N-bit DAC. DAC 110 provides that control word at some determined instant. Reference source 112 provides a stable reference signal to comparator function 108. Source 112 is utilized as a comparative target or goal for the output performance of replica 114.

Replica 114 provides a matched on-chip replication of component 116, or some critical performance portion of component 116 that requires calibration. Since IC devices generally track very well within a single die (i.e., around about 0.5% variation, depending on design, process and layout), critical characteristic(s) of component 116 may be evaluated using replica 114. The operational performance of replica 114 is compared to source 112 by function 108. The differential result is communicated to state machine 106, which then calculates the appropriate N-bit code for DAC 110. DAC 110 converts the N-bit code into the control word for component 116, which is then set accordingly.

Some conventional applications, where extremely fine calibration (e.g., 0.5%, or better) is required, may require a different embodiment of system 100. This is due to the fact that replica matching at such a high level of precision may not be possible. Such an embodiment is illustrated in reference now to system 200 of FIG. 2. In system 200, estimation is performed on the tunable component itself, not on a replica of the component.

Figure 2:
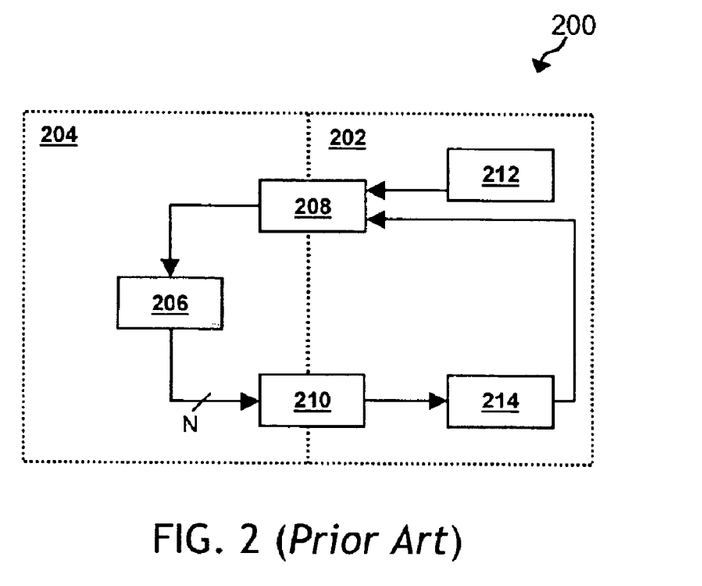
FIG. 2 is an illustration of a PRIOR ART component calibration system.

Similar to system 100, system 200 comprises an analog operational environment 202 and digital operational environment 204, a control state machine 206, a comparator 208, a DAC 210, and a reference source 212. System 200 further comprises a target component 214. Component 214 comprises a programmable device operating in analog environment 202. Component 214 has its control word provided by DAC 210, which is an N-bit DAC. DAC 210 provides that control word at some determined instant. Reference source 212 provides a stable reference signal to comparator function 208. Source 212 is utilized as a comparative target or goal for the output performance of component 214. The operational performance of component 214 is compared to source 212 by function 208. The differential result is communicated to state machine 206, which then calculates an appropriate N-bit code for DAC 210. DAC 210 converts the N-bit code into a revised control word for component 214, which is then set accordingly.

In this embodiment, the DAC output is converging toward the desired tuned value through a Successive Approximation Register (SAR) sequence. A dichotomy algorithm is utilized—dividing whatever remaining differential (or error) exists by two, iteratively. This implementation may also be viewed as a SAR analog to digital converter (ADC)—where the analog input is the reference signal, and the digital output is the digital code of the state machine.

Figure 3:
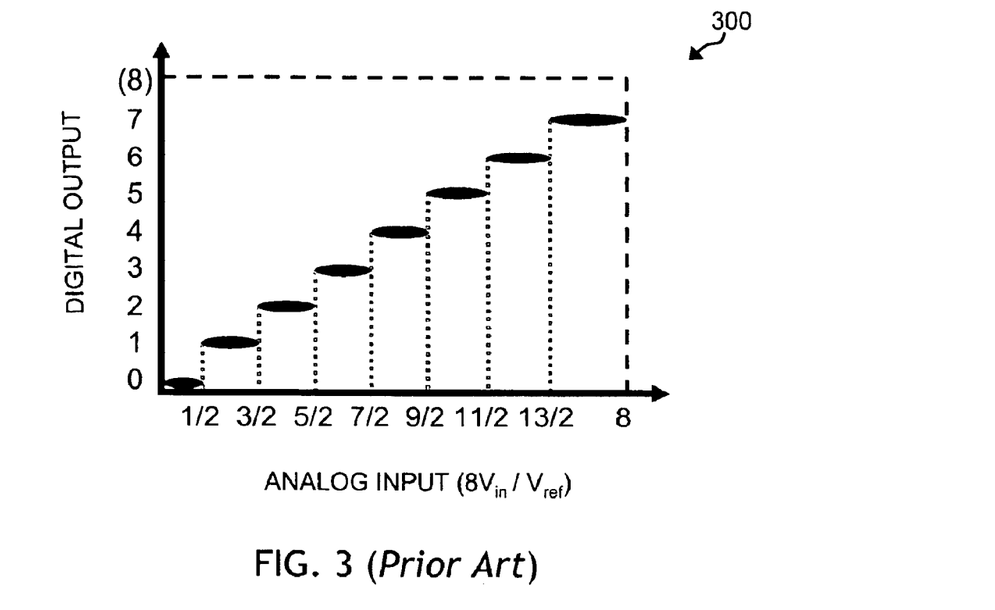
FIG. 3 is a depiction of a transfer function for a PRIOR ART component calibration system.
Figure 4:
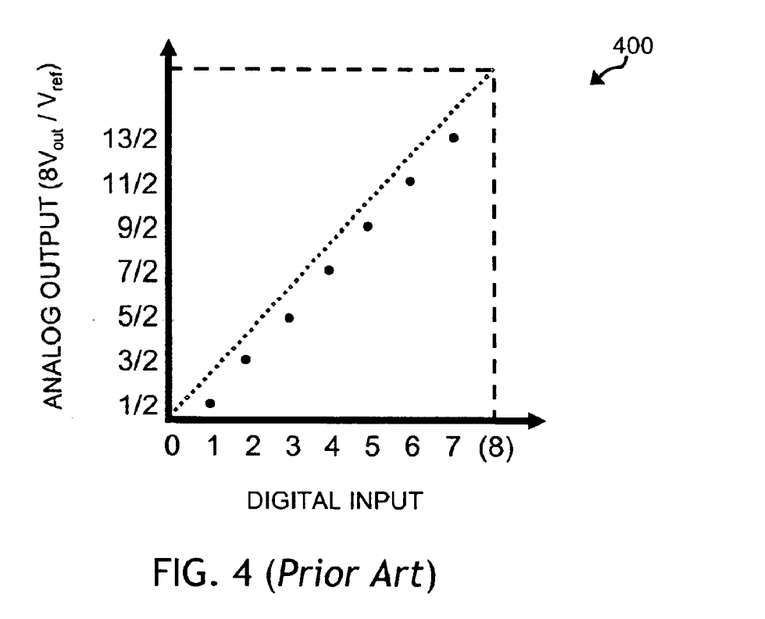
FIG. 4 is a depiction of a transfer function for a PRIOR ART component calibration system.

In order to implement an N-bit SAR ADC according to conventional methods, an N-bit DAC—outputting threshold voltage of the desired ADC—is required. FIG. 3 depicts a plot 300 of the transfer function of, for example, a conventional 3-bit ADC, and FIG. 4 depicts a plot 400 of the transfer function of a corresponding conventional 3-bit SAR DAC—the outputs of which are shifted by one half of a least significant bit (LSB). Thus, by conventional methods, in order to achieve an N-bit resolution (within ½ LSB accuracy) in the SAR convergence scheme, an (N+1)-bit DAC is needed. As the value of the target component to be tuned is fixed by the main circuit design, sizes can, physically, be relatively small with poor matching and high parasitics—inducing drastic non-linearity in the DAC itself. As previously described, drastic non-linearities present a number of problems negatively impacting the resolution of a single DAC system.

Figure 5:
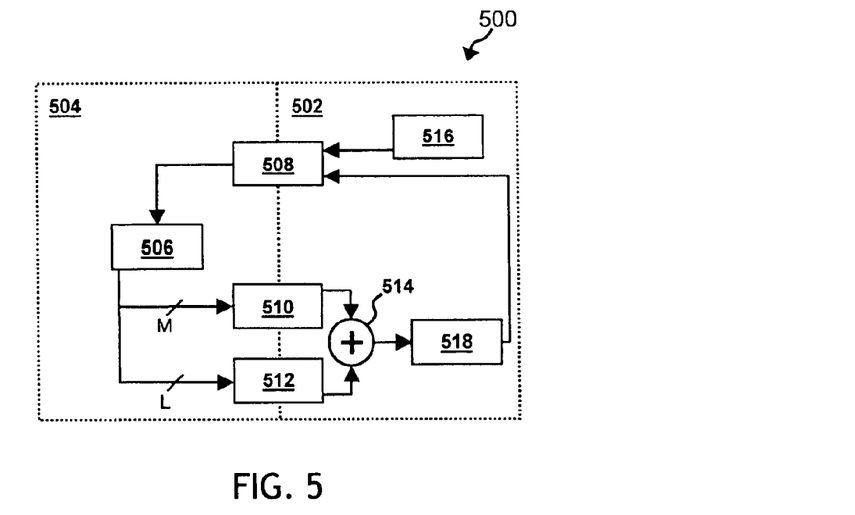
FIG. 5 is an illustration of one embodiment of a component calibration system according to the present invention.

In contrast, systems according to the present invention are provided with multiple DACs, as illustrated with reference now to system 500 as depicted in FIG. 5. System 500 comprises a number of constituent members operating within one of, or in transition between, analog operational environment 502 and digital operational environment 504, and communicatively intercoupled as described hereinafter. System 500 comprises a control function 506 (e.g., a state machine), a comparator function 508, a first (or primary) DAC function 510, a second (or supplemental) DAC function 512, a summing function 514, and a reference source 516. The signal supplied from signal source 516 is analog. In alternative embodiments, any practical desired number of supplemental DACs may be provided in addition to supplemental DAC 512— similarly implemented and utilized for sub-ranging in accordance with the present invention. Due to their functional separation, the DACs may be provided in physically separate areas of an individual die—providing a high degree of design flexibility. System 500 is provided to calibrate to an equivalent N-bit target.

System 500 further comprises a target component 518. Component 518 comprises a programmable device (e.g., a component array) operating in analog environment 502. Component 518 may comprise any desired type of device that may be implemented in a programmable fashion (e.g., resistor, capacitor, inductor). Component 518 has its control word provided by summing function 514, which combines the signals produced by DACs 510 and 512. DAC 510 is an M-bit DAC, and DAC 512 is an L-bit DAC. DACs 510 and 512 and, correspondingly, summing function 514 provide a control word signal at some selected instant or interval (e.g., at device power-up, after a certain number of clock cycles, etc.).

Reference source 516 provides some stable, highly accurate reference signal to comparator function 508. Source 516 may comprise an available on-chip reference, such as a bandgap voltage (e.g., 99% accuracy) or a clock frequency (e.g., 5 ppm accuracy). Source 516 is utilized as a comparative target or goal for the output performance of component 518. The operational performance of component 518 is compared to source 516 by function 508. The differential result is communicated to state machine 506, which then calculates appropriate M-bit and L-bit codes for DACs 510 and 512, respectively, as described in greater detail hereinafter. DACs 510 and 512 convert the codes into control signals, which are combined by summing function 514 and transmitted to component 518 as a revised control word. Component 518 is set accordingly.

The DAC output converges toward the desired calibration value through a SAR sequence. A dichotomy (or other suitable) algorithm, as described in greater detail hereinafter, is utilized—dividing whatever remaining differential (or error) exists by two, iteratively. This embodiment may also be considered a SAR ADC, having the reference signal for an analog input and the combined digital code of the state machine for a digital output.

Figure 6:
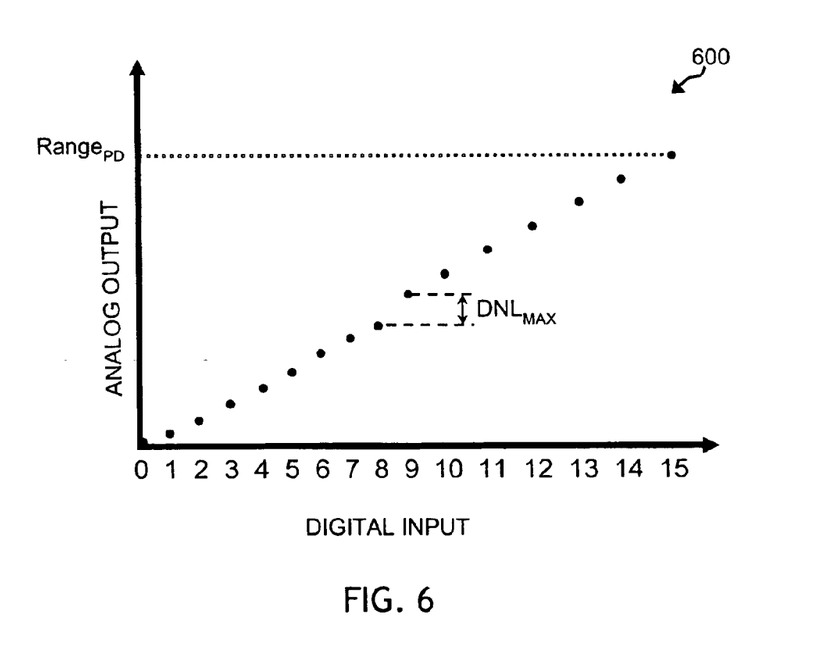
FIG. 6 is a depiction of a transfer function for a primary DAC according to the present invention.
Figure 7:
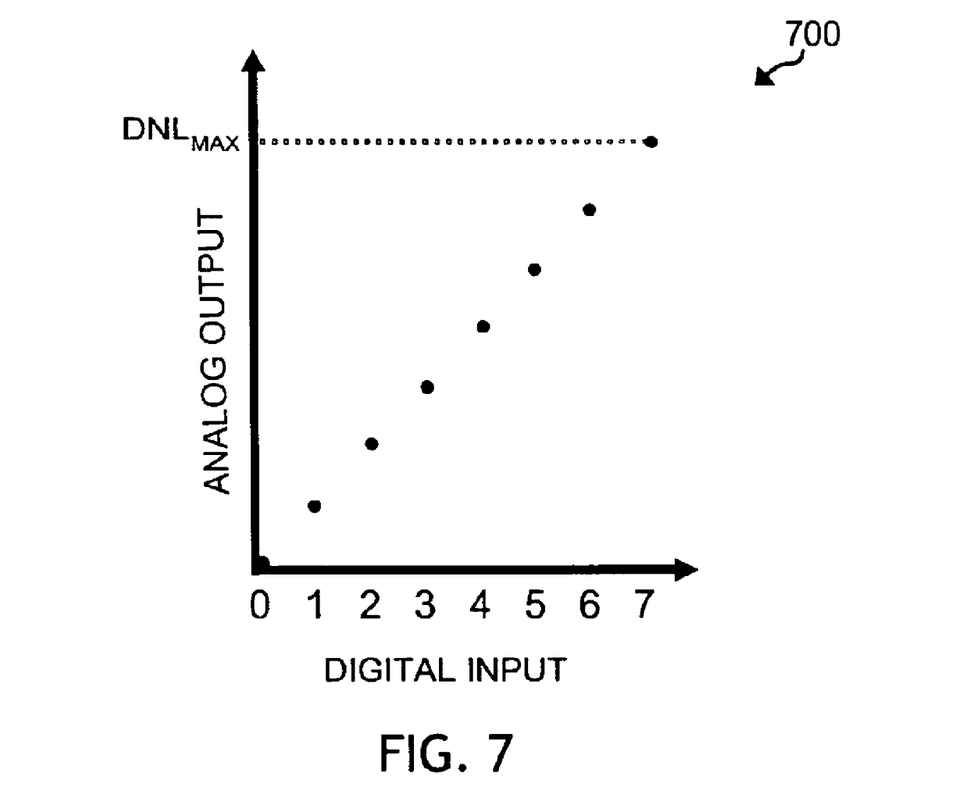
FIG. 7 is a depiction of a transfer function for a supplemental DAC according to the present invention.

In system 500, DAC 510 is designed to cover the full range ($Range_{PD}$) of process and design variations in the target component(s) with a resolution smaller than the equivalent overall DAC target (M<N). DAC 510 can tolerate a limited linearity ($\pm 2^k$ LSB DNL). DAC 512 is designed to cover the full range of the estimated maximum step of DAC 510 ($DNL_{MAX}$) plus, optionally, some nominal overlap. DAC 512 may be provided with a lower resolution than DAC 510 (e.g., L=N–M--bits). In alternative embodiments, DAC 512 may be provided with resolution equivalent to or greater than DAC 510. In system 500, however, the low resolution of DAC 512 provides for full thermometer decoding—ensuring very good linearity (i.e., better than ½ an LSB). The decoding and functional operations of system 500 are further described in detail hereinafter. For purposes of illustration and explanation, FIGS. 6 and 7 depict plots 600 and 700, illustrating the transfer functions of DACs 510 and 512, respectively, for one simple example where (N=6, M=4, L=3, K=1).

Figure 8:
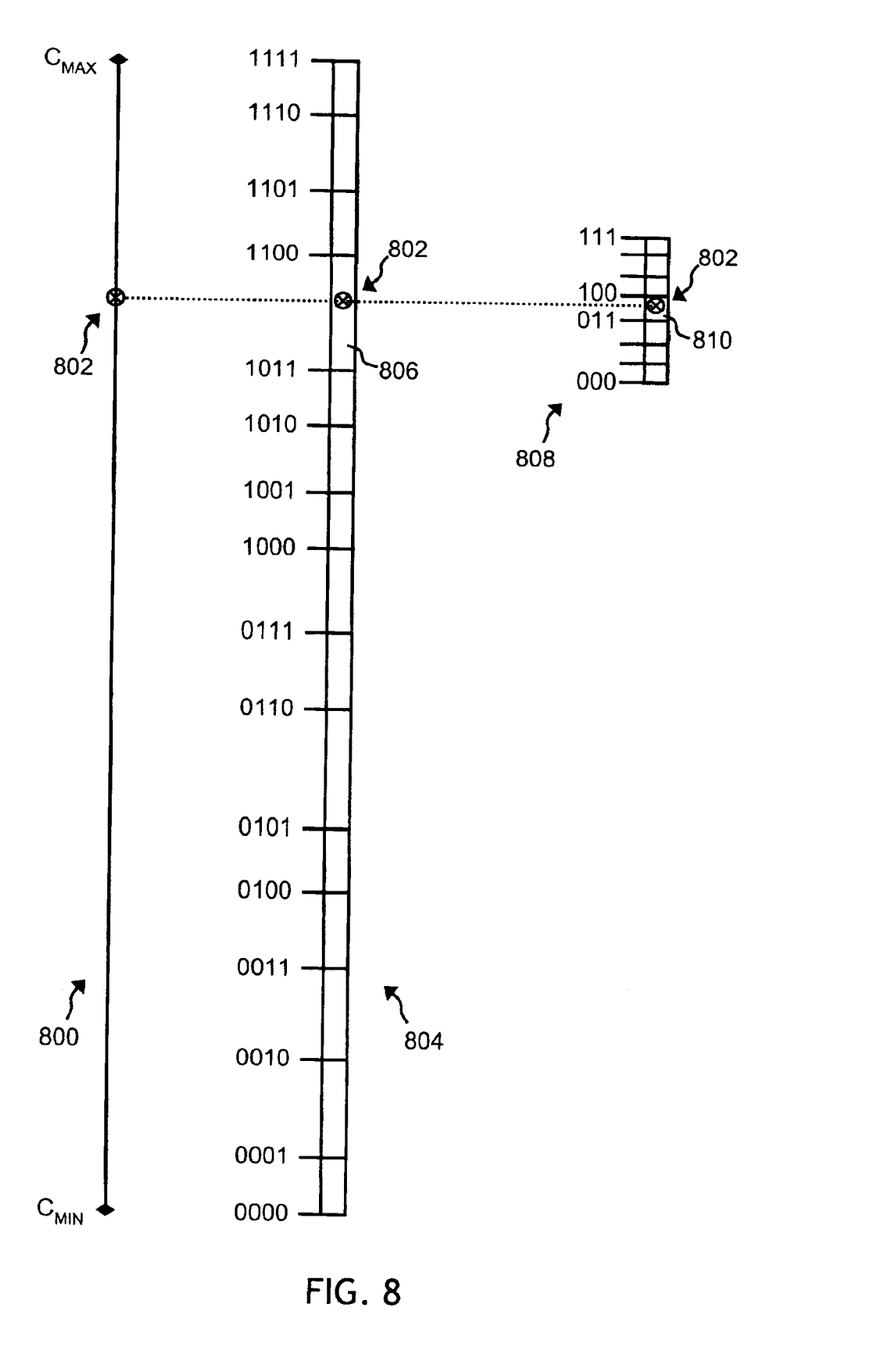
FIG. 8 is an illustration of one embodiment of component calibration according to the present invention.

Referring now to FIG. 8, an illustrative example of embodiment of the operation and function of a system according to the present invention is depicted. For purposes of illustration and explanation, that operation and function is described hereinafter in reference to system 500. FIG. 8 depicts a scale 800 that represents the maximum ($C_{MAX}$) and minimum ($C_{MIN}$) array values for a particular target component (C). The desired value ($C_{GOAL}$) for component C is represented along scale 800 by indicator 802. Scale 804 represents a code scale for a primary DAC. For purposes of this illustration, the primary DAC is 4-bit. Thus, each of the binary steps, from 0000 to 1111, along scale 804 represent a distinct code for the primary DAC, and correspond to selectable array elements that will comprise the final value ($C_{FINAL}$) of C. As illustrated by scale 804, the individual step sizes need not be, and most often are not, of equivalent size. The primary DAC thus exhibits a relatively high degree of non-linearity. In alternative embodiments where the primary DAC, either randomly or through design modifications, does exhibit a greater relative degree of linearity, the function and operation of the present invention are substantially unaffected—although even greater calibration accuracy may result.

Given the value of $C_{GOAL}$ 802, a state machine (e.g., function 506) utilizes an algorithm (e.g., dichotomy algorithm) or other suitable scheme to determine a binary step, and its corresponding code, closest to $C_{GOAL}$ 802. For example, in one embodiment may start at the first step and continue incrementing steps until determining that the DAC step value has just exceeded $C_{GOAL}$. The state machine may then use that DAC code or, alternatively, may decrement by one step to use the code just below $C_{COAL}$. In another embodiment, the state machine may implement a mid-code parsing scheme to determine a binary step closest to $C_{GOAL}$ 802. One example of such a scheme is illustrated by the following pseudo-code segment:

```
(* Assuming code range from 0000 to 1111 *)
FinalCode = [ ];
CodeMin = 0000, CodeMax = 1111;
REPEAT UNTIL (CodeMax - CodeMin = 1)
    Select MidCode;
    (* Evaluate equivalent component value of DAC at MidCode *);
    IF DAC(MidCode) < C_GOAL, THEN
        CodeMin = MidCode;
    ELSE
        CodeMax = MidCode;
FinalCode = CodeMax;
RETURN FinalCode.
```

In this embodiment, FinalCode returns the code step just above $C_{GOAL}$. In alternative embodiments, FinalCode may return the code step just below $C_{GOAL}$, depending upon desired system performance. Utilizing this algorithm, the code returned for scale 804 is 1100. The system has now determined that $C_{GOAL}$ lies within the step below 1100, depicted in FIG. 8 as step 806.

Having now determined the primary step within which $C_{GOAL}$ lies, sub-ranging with one or more supplemental DACs begins. Scale 808 represents a code scale for a secondary DAC. The overall size of this scale is substantially smaller than scale 804. Scale 808 need only be as large as the largest possible step from scale 804, which may be readily determined from design and fabrication parameters of the primary DAC. In certain embodiments, it may be desirable for scale 808 to be just slightly larger than the largest possible step from scale 804, allowing for a slight overlap. For purposes of this illustration, the secondary DAC is 3-bit. Thus, each of the binary steps, from 000 to 111, along scale 808 represent a distinct code for the secondary DAC, and correspond to selectable array elements that will comprise the final value ($C_{FINAL}$) of C. Again, the individual step sizes of the secondary DAC need not be, and most often are not, of equivalent size. The secondary DAC thus also exhibits non-linearity.

Given the value of $C_{GOAL}$ 802, and the boundaries of the primary step (i.e., CodeMin=1011 and CodeMax=1100), a state machine (e.g., function 506) utilizes an algorithm (e.g., dichotomy algorithm) or other suitable scheme to determine a binary step, and its corresponding code, closest to $C_{GOAL}$ 802. The state machine function may be the same one that performed the determination for the primary DAC or, alternatively, it may be a different state machine function. The state machine function may utilize the same algorithm or scheme that was used to determine the primary step or, alternatively, it may employ a different algorithm or scheme. Regardless of the scheme used, the state machine determines the secondary step within which $C_{GOAL}$ lies. Following the process illustrated in example pseudo-code (1), the code returned for scale 808 is 100. The system has now determined that $C_{GOAL}$ lies within the step below 100, depicted in FIG. 8 as step 810. For this example, $C_{FINAL}$ is rendered from summing function 514 based on the code 1100100.

The relative step size between 100 and 011 on scale 808 represents a very small fraction of scale 800. Thus, the differential between $C_{FINAL}$ and $C_{GOAL}$ is very small —resulting in a very high calibration resolution. In applications requiring even finer calibration resolution, tertiary and higher order DACs may be implemented and operated in similar fashion to provide the desired result.

In all embodiments of the present invention, the constituent functions and components may be implemented in a wide variety of ways—comprising software and hardware constructs, and combinations of both. For example, the various algorithms and routines described herein may be implemented as separate code segments, or as part of a larger integrated code segment. Those code segments may comprise software operating on a host computer system, or routines operating on a digital signal processor. The comparator function may comprise an independent semiconductor device, it may comprise a sub-portion of some other semiconductor device, or it may be implemented as a combination of hardware and software. The state machine function may comprise a routine or code segment operating on a processor, or a simple programmable logic device. The DACs may comprise distinct semiconductor devices, operational divisions of a single device, or code structures operating on a processor. All of these variations, and all other similar variations and combinations, are comprehended by the present invention. All such embodiments may be employed to provide the benefits of the present invention.

Thus, the embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As indicated, many modifications and variations are possible in light of the above teaching without departing from the spirit and scope of the following claims.

What is claimed is:

1. A semiconductor device comprising:
   an analog reference signal;
   a comparator function communicatively coupled to the analog reference signal;
   a controller communicatively coupled to the comparator function;
   a primary DAC function communicatively coupled to a state machine and to a summer;
   a supplemental DAC communicatively coupled to the state machine and to the summer; and
   a target component communicatively coupled to the summer and the comparator.

2. The device of claim 1, wherein the analog reference signal comprises a bandgap voltage.

3. The device of claim 1, wherein the analog reference signal comprises a clock signal.

4. The device of claim 1, wherein the comparator comprises an independent device.

5. The device of claim 1, wherein the comparator comprises a sub-portion of another device.

6. The device of claim 1, wherein the comparator comprises a combination of hardware and software.

7. The device of claim 1, wherein the controller comprises a state machine function.

8. The device of claim 1, wherein controller comprises a programmable logic device.

9. The device of claim 1, wherein the controller comprises a code segment operating on a processor.

10. The device of claim 1, wherein the primary DAC comprises an independent DAC device.

11. The device of claim 1, wherein the primary DAC comprises a sub-portion of a DAC device.

12. The device of claim 1, wherein the primary DAC comprises a code segment operating on a processor.

13. The device of claim 1, wherein the supplemental DAC comprises an independent DAC device.

14. The device of claim 1, wherein the supplemental DAC comprises a sub-portion of a DAC device.

15. The device of claim 1, wherein the supplemental DAC comprises a code segment operating on a processor.

16. The device of claim 1, wherein the summer comprises an independent device.

17. The device of claim 1, wherein the summer comprises a sub-portion of another device.

18. The device of claim 1, wherein the summer comprises a code segment operating on a processor.

19. The device of claim 1, wherein the target component comprises a programmable array.

20. The device of claim 19, wherein the target component comprises a programmable resistor array.

21. The device of claim 19, wherein the target component comprises a programmable capacitor array.

22. The device of claim 19, wherein the target component comprises a programmable inductor array.

23. A method of providing high-resolution calibration of a programmable semiconductor component, the method comprising the steps of:

providing a programmable semiconductor component;

providing a goal value for the programmable semiconductor component;

providing primary and supplemental DAC functions;

providing a control function;

utilizing the control function to determine a first bit step of the primary DAC function corresponding to the goal value;

utilizing the control function to determine a second bit step of the supplemental DAC function corresponding to the goal value; and combining bit codes of the first and second bit steps to provide a control word for programming the programmable semiconductor component.

24. The method of claim 23, further comprising the steps of:

providing a reference signal;

determining a differential between the reference signal and a programmed value of the programmable semiconductor component; and communicating the differential to the control function.

25. The method of claim 24, wherein the steps of determining a differential, communicating the differential, utilizing the control function, and combining bit codes to provide a control word are performed as part of an iterative process.

26. The method of claim 23, wherein a plurality of supplemental DAC function are provided and the control function is utilized to determine bits steps for each, sequentially.

27. The method of claim 23, wherein the control function utilizes a dichotomy algorithm.

28. The method of claim 23, wherein the control function utilizes an incremental parsing algorithm.

* * * * *